US008300242B2

(12) United States Patent
Suzuki

(10) Patent No.: US 8,300,242 B2
(45) Date of Patent: Oct. 30, 2012

(54) IMAGE FORMING APPARATUS AND PULSE GENERATING METHOD

(75) Inventor: Toshiyuki Suzuki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 1071 days.

(21) Appl. No.: 12/237,171

(22) Filed: Sep. 24, 2008

(65) Prior Publication Data

US 2009/0079999 A1 Mar. 26, 2009

(30) Foreign Application Priority Data

Sep. 25, 2007 (JP) ................................ 2007-247500

(51) Int. Cl.
*G06K 15/00* (2006.01)
*H04N 1/00* (2006.01)
*G08C 17/00* (2006.01)
*G03G 15/01* (2006.01)
*G01R 19/00* (2006.01)

(52) U.S. Cl. .................. 358/1.14; 358/1.1; 358/426.09; 341/183; 377/118; 399/303; 327/18

(58) Field of Classification Search ..................... 327/18
See application file for complete search history.

(56) References Cited

U.S. PATENT DOCUMENTS 6,842,602 B2 1/2005 Kudo
2006/0119695 A1 * 6/2006 Kojima ........................ 347/164

FOREIGN PATENT DOCUMENTS

| | | |
|---|---|---|
| JP | 11-245383 | 9/1999 |
| JP | 2003-103775 | 4/2003 |
| JP | 2003-280484 | 10/2003 |
| JP | 2003-280484 A | 10/2003 |
| JP | 2004-155563 A | 6/2004 |
| JP | 2005-238706 A | 9/2005 |
| JP | 2005-350195 | 12/2005 |
| JP | 2006-096429 | 4/2006 |
| JP | 2007-105975 | 4/2007 |
| JP | 2007-168226 | 7/2007 |

* cited by examiner

*Primary Examiner* — Thomas Lett
(74) *Attorney, Agent, or Firm* — Maschoff Gilmore & Israelsen

(57) ABSTRACT

An image forming apparatus records an image on a transported recording medium. The apparatus includes a transportation unit that transports the recording medium and a recording unit that records the image on the recording medium. An encoder outputs an encoder signal including pulses according to a position of the transportation unit. A measurement unit measures a pulse period of the encoder signal, and the measured pulse period is stored by a storage unit. A detection unit detects pulse omission of the encoder signal on the basis of the value measured by the measurement unit. A pulse generation unit generates a recording timing pulse on the basis of the pulse period when the pulse omission is not detected and generates the recording timing pulse on the basis of the pulse period stored in the storage unit and measured before the pulse omission when the pulse omission is detected.

5 Claims, 8 Drawing Sheets

IMAGE FORMING APPARATUS AND PULSE GENERATING METHOD

BACKGROUND

1. Technical Field

The present invention relates to an image forming apparatus for generating a recording timing pulse for driving a recording unit for performing recording with respect to a recording medium on a transporting unit on the basis of an encoder signal for detecting a transporting position of the transporting unit, and a pulse generating method.

2. Related Art

In an image forming apparatus such as a printer, a recording head performs printing on a sheet transported in a transportation direction. In this case, since ink droplets need to be discharged at adequate timings according to the positions of the sheet, a print reference signal is generated in synchronization with a transportation speed of the sheet on the basis of an output signal output from an encoder in synchronization with the transportation speed of the sheet and the discharge timings are controlled on the basis of the print reference signal.

For example, in JP-A-11-245383, a printer (image forming apparatus) using a transportation belt as a sheet transportation unit is disclosed. A mark for detecting the speed and the position is provided on the transportation belt, the mark is read by an encoder, and an ink is discharged on the basis of the encoder signal, thereby printing letters or images on the sheet.

In a printer using the transportation belt as the sheet transportation unit in JP-A-11-245383, under the condition that it is assumed that the movement amount of the belt and the movement amount of the a recording sheet are equal to each other, the movement amount of the recording sheet is detected from the movement amount of the belt and the ink droplets are discharged in every desired pitch. Since the ink droplets are discharged in synchronization with the encoder signal having a pulse having the same interval as a print pitch, high-quality printing for controlling a shift of a striking position can be realized even when the speed of the transportation unit is changed. However, in the method of JP-A-11-245383, since the encoder signal needs to be continuously output at a regular pitch, the following problems occur.

In a case where the circumferential length of the transportation unit (transportation belt) of the recording sheet is not an integral multiple of a print pitch, a discontinuous portion is generated in the output signal of the linear encoder and thus an image deteriorates. In a case where an ink mist or a paper dust is adhered to the linear encoder arranged on the transportation belt or the linear encoder is damaged, a pulse is omitted in the encoder signal. In this case, the image deteriorates.

An apparatus for solving the above-described problems is disclosed in JP-A-2003-280484 (for example, paragraphs [0023] to [0061], FIG. 1, FIG. 9, FIGS. 10 to 22) and JP-A-2005-350195 (for example, [0041] to [0053] and FIGS. 6 to 11).

The printer disclosed in JP-A-2003-280484 controls a motor speed using a linear encoder by a PLL, has a discontinuous detection unit of the linear encoder, and changes a speed/position control unit on the basis of the detected result of the discontinuous detection unit. In the discontinuous portion, an output interval average value of the output signal measured in a continuous portion is used. As countermeasures against a long discontinuous portion, a controlling method using two sensors is described and a problem that the speed of the belt cannot be detected for a long time period is avoided.

In JP-A-2005-350195, two sensors for detecting a mark are provided such that positions to be detected are different from each other and, when a discontinuous portion of the mark such as a joint of a transportation belt or the omission of a pulse due to dust or flaws is detected on the basis of an output signal of one sensor, an output signal used for motor control for constantly controlling a belt transportation speed is switched to the other sensor. In order to suppress a phase difference between the signals when the sensor is switched, a measured period is divided or the same clock is used such that an interpolation processing unit generates a high-resolution signal so as to reduce a signal matching error (phase difference). In JP-A-2003-280484 or JP-A-2005-350195, a method of counting the period of the sensor signal (encoder signal) by a base clock and determining the discontinuous portion (the omission of the pulse signal of the encoder signal) of the mark in a case where the period of the pulse of the sensor signal is equal to or greater than a predetermined threshold value is disclosed.

However, in JP-A-2003-280484, since a method of improving print precision by controlling the motor speed such that the speed of the transportation belt becomes a predetermined speed is employed, a controller for controlling the motor becomes complicated and the control vibrates. In JP-A-2005-350195, since a method of improving print precision by controlling the motor speed such that the speed of the transportation belt becomes a predetermined speed, the control is susceptible to be divergent and thus a control gain needs to be adjusted by an apparatus.

SUMMARY

An advantage of some aspects of the invention is that it provides an image forming apparatus which is capable of generating a recording timing signal by a relatively simple configuration without deteriorating recording precision on the basis of an encoder signal while a transportation speed is slightly allowed to be changed although the encoder signal for detecting a transportation position of a transportation unit has a discontinuous portion, and a pulse generating method.

According to an aspect of the invention, there is provided an image forming apparatus for performing recording in order to form an image on a transported recording medium, the apparatus including: a transportation unit which transports the recording medium; a recording unit which performs recording in order to form the image on the recording medium transported by the transportation unit; an encoder which outputs an encoder signal including pulses according to a transportation position of the transportation unit; a measurement unit which measures a pulse period of the encoder signal; a storage unit which stores the measured pulse period; a detection unit which detects pulse omission of the encoder signal on the basis of the measured value of the measurement unit; and a pulse generation unit which generates a recording timing pulse on the basis of the pulse period stored in the storage unit when the pulse omission is not detected and generates the recording timing pulse on the basis of the pulse period stored in the storage unit and measured before the pulse omission when the pulse omission is detected.

According to the invention, the pulse period of the encoder signal is measured and the measured pulse period is stored. The recording timing pulse is generated so as to connect the pulses on the basis of the pulse period stored in the storage unit. If the pulse omission of the encoder signal is detected by the detection unit, the recording timing pulse is generated so as to connect the pulses on the basis of the pulse period measured before the pulse omission stored in the storage unit. Accordingly, although the transportation speed of the transportation unit is changed, the pulses can be generated at a constant interval (period). For example, if the recording timing pulse is generated on the basis of the pulses of the encoder signal according to the transportation position of the transportation unit, when the pulse omission is detected, the recording timing pulse is generated on the basis of a predetermined constant period (fixed period), for example, a timer pulse is used. In contrast, since the present invention is embodied based on the pulse period of the encoder signal for detecting the transportation position of the transportation unit, the pulse can be generated with the period according to the transportation speed of the transportation unit. In a configuration in which the plurality of encoder signals are received, although the pulse omission of one encoder signal occurs, the recording timing pulse can be generated on the basis of the pulses of another encoder signal. However, a phase difference occurs when the recording timing pulse based on the pulses of one encoder signal and the recording timing pulse based on the pulses of another encoder signal are connected. However, according to the present invention, since the pulses are connected in the pulse period, the phase difference between the recording timing pulses before and after the pulse omission does not occur.

In the image forming apparatus of the invention, the detection unit may detect the pulse omission when the value measured by the measurement unit exceeds a threshold having a value larger than the pulse period according to the pulse period stored in the storage unit.

According to the invention, the detection unit detects the pulse omission when the value measured by the measurement unit exceeds the threshold having the value larger than the pulse period according to the past pulse period (for example, a previous pulse period) stored in the storage unit in the past. Accordingly, the pulse omission can be detected using the measured value for measuring the pulse period in order to generate the pulse and the past pulse period stored in the storage unit in order to the pulse. Accordingly, a dedicated detection unit for only detecting the pulse omission does not need to be provided.

In the image forming apparatus of the invention, the encoder may include a scale unit provided along a transportation direction of the transportation unit and a plurality of sensors each of which outputs the encoder signal including the pulses according to the transportation position of the transportation unit using different positions of the scale unit as an object to be detected, and the detection unit may detect the pulse omission on the basis of the encoder signal from at least one of the plurality of sensors and include a switching unit which switches the sensor using the pulse period when the pulse generation unit generates the pulses when the pulse omission is detected.

According to the invention, if the pulse omission is detected, the sensor can be switched. Accordingly, it is possible to generate the pulse using a newest pulse period without using the old pulse period which was measured in the past.

In the image forming apparatus of the invention, when the detection unit detects the pulse omission in all the plurality of sensors, the pulse generation unit may generate the pulses on the basis of the pulse period of one sensor stored in the storage unit.

According to the invention, if the pulse omission is detected, the sensor can be switched. Accordingly, it is possible to generate the pulse using a newest pulse period without using the old pulse period which was measured in the past. In addition, if the pulse omission is detected in all the sensors, the pulse is generated using an older pulse period stored in the storage unit.

In the image forming apparatus of the invention, the storage unit may latch pulse period data on the basis of the detected result when the detection unit detects the pulse omission, the detection unit may be set so as to detect the pulse omission when the pulse period which is being measured by the measurement unit exceeds the threshold of a product of a newest pulse period, in which the pulse omission is not detected, and a set value, and the set value may be set to a value less than the number of pieces of data to be latched in the storage unit.

According to the invention, if the measured value which is being measured by the measurement unit exceeds the threshold of the product of a newest pulse period, in which the pulse omission is not detected, and the set value, the pulse omission is detected. Although the measured value exceeds the threshold after the elapse of the time of product of the newest pulse period and the set value and the pulse omission is detected, since the pulse period data when the pulse omission is not detected is stored in the storage unit, the recording timing signal can be generated.

According to another aspect of the invention, there is provided a pulse generating method of generating a recording timing pulse for deciding a recording timing when recording is performed in order to form an image on a recording medium, the method including: measuring a pulse period of an encoder signal for outputting the encoder signal according to a transportation position of a transportation unit for transporting the recording medium; storing the measurement pulse period in the storage unit; detecting pulse omission of the encoder signal; and generating the recording timing pulse on the basis of the pulse period stored in the storage unit when the pulse omission is not detected and generating the recording timing pulse on the basis of the pulse period stored in the storage unit and measured before the pulse omission when the pulse omission is detected. According to the invention, the same effects as the image forming apparatus can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Hereinafter, a first embodiment of the invention will be described with reference to FIGS. 1 to 9.

Figure 1:
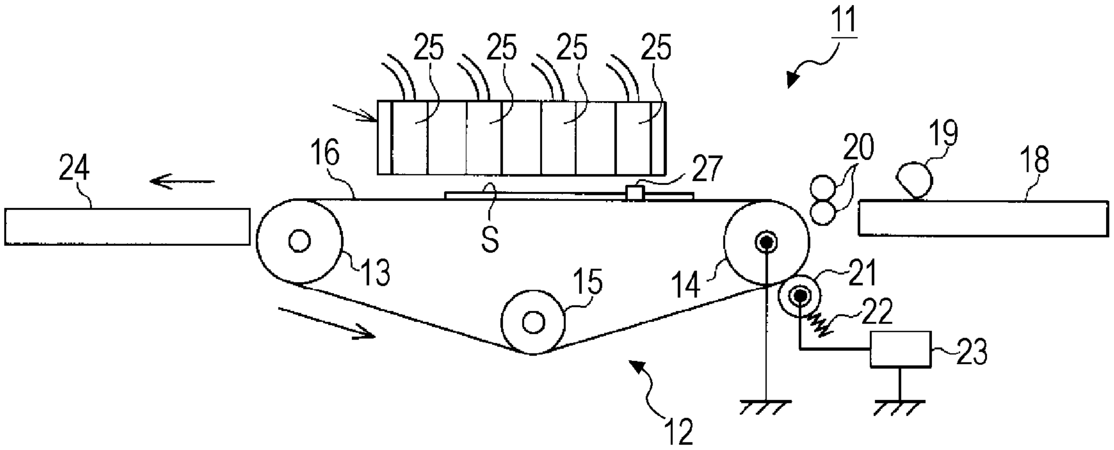
FIG. 1 is a side view showing the schematic configuration of a printer according to a first embodiment of the invention.
Figure 2:
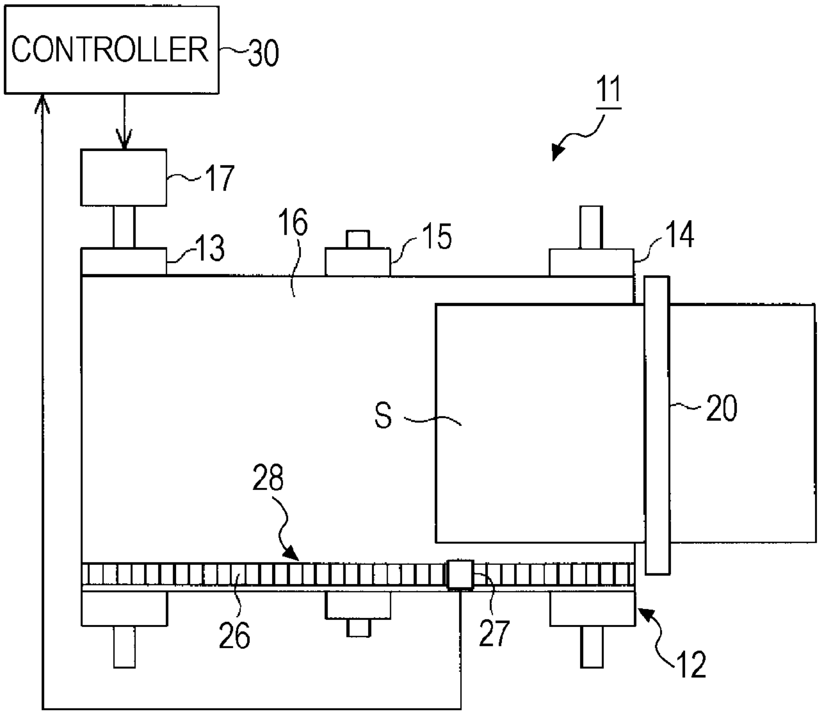
FIG. 2 is a plan view of the printer in which a recording head is omitted.

FIG. 1 is a side view of an ink jet recording apparatus and FIG. 2 is a plan view thereof. In FIG. 2, a recording head is omitted.

As shown in FIGS. 1 and 2, an ink jet recording apparatus (hereinafter, referred to as a printer 11) as an image forming apparatus includes a belt transportation device 12 for transporting a recording sheet S. The bet transportation device 12 includes a driving roller 13 which is provided on the downstream side of a sheet transportation direction, a driven roller 14 provided on the upstream side of the sheet transportation direction, a tension roller 15 which is provided at a substantially intermediate position between the driving roller 13 and the driven roller 14 and is provided on the slightly lower side (see FIG. 2) of the rollers, and an endless transportation belt 16 stretched over the rollers 13 to 15.

As shown in FIG. 2, an output shaft of an electric motor 17 is connected to the driving roller 13 directly or a deceleration mechanism (not shown) such that power can be delivered. When the electric motor 17 rotates forward, the driving roller 13 rotates and the transportation belt 16 rotates in a direction which can transport the recording sheet S from the upstream side to the downstream side.

A feed unit 18 is provided on the upstream side of the belt transportation device 12 and the recording sheet S loaded in the feed unit 18 is fed by a feed roller 19 one by one. A gate roller 20 is interposed between the feed unit 18 and the belt transportation device 12 and the recording sheet S is fed onto the transportation belt 16 by the rotation of the gate roller 20. The gate roller 20 abutting the recording sheet S against the roller surface so as to correct the screw of the recording sheet S by and sets a drive start timing so as to transmit the recording sheet S such that the recording sheet S is positioned at a target position of the transportation belt 16.

A charge roller 21 which is energized to the driven roller 14 by a spring 22 and is brought into contact with the driven roller 14 with the transportation belt 16 interposed therebetween is provided below the driven roller 14. The charge roller 21 is connected to a power source 23, and charges are charged on the transportation belt 16 by the charge roller 21, and the recording sheet S is electrostatically attracted by the charges on the transportation belt 16. The method of attracting the recording sheet to the belt is not limited to the electrostatic attraction method and, for example, a negative pressure attraction method of generating attraction airstream from an attraction hole formed in the transportation belt 16 by negative pressure may be employed. An ejection unit 24 for ejecting the recording sheet S after print from the transportation belt is provided on the downstream side of the belt transportation device 12.

Long head recording heads 25 of line head manner are provided above the intermediate position of the transportation direction of the transportation belt 16 in a direction parallel to the width direction of the transportation belt 16. A nozzle array including a plurality of nozzles arranged over a wider area than the entire widthwise area of the recording sheet S having a maximum width, which can be printed by the printer 11, with a predetermined nozzle pitch is provided in the lower surface (nozzle forming surface) of each of the recording heads 25. Ink droplets are sequentially ejected from the nozzles at timings according to a sheet transportation speed while the recording sheet S is transported such that an image can be printed on the recording sheet S. In the present example, the recording heads 25 are connected to ink cartridges (not shown) via ink supply tubes and discharge inks supplied from the respective ink cartridges. In the present example, the recording heads 25 sequentially discharge the ink droplets of four colors of black, cyan, magenta and yellow from the upstream side (the right side of FIG. 1).

As shown in FIG. 2, at an edge portion on the upper surface of the transportation belt 16, a magnetic linear scale 26 is provided over the entire circumference of the transportation belt 16 along the transportation direction. In the magnetic linear scale 26, a magnetic pattern is recorded on a band-shaped magnetic recording layer formed on the edge portion of the transportation belt 16 with a predetermined pitch. A magnetic sensor 27 for reproducing the magnetic pattern recorded on the magnetic linear scale 26 is provided in the vicinity of the upper side (the front side of FIG. 1) of the magnetic linear scale 26. A magnetic linear encoder (hereinafter, referred to as a linear encoder 28) is configured by the magnetic linear scale 26 and the magnetic sensor 27. In the printer 11, a controller 30 is provided as a control unit. The controller 30 controls the driving of the electric motor 17 (shown in FIG. 2) generates a print reference signal (ejection timing signal) (see FIG. 7) generated by an internal circuit on the basis of a linear encoder signal ES received from the magnetic sensor 27, and controls the ejection of the ink droplets at adequate times according to the sheet transportation speed (sheet transportation position) on the basis of the print reference signal.

Figure 3:
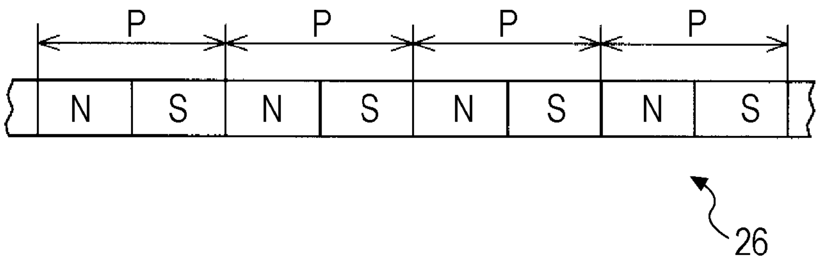
FIG. 3 is a plan view showing a magnetic linear scale.

FIG. 3 is a view showing a portion of a magnetization pattern of the magnetic linear scale. As shown in FIG. 3, the magnetization pattern which is magnetized such that an N pole and an S pole are alternately arranged with a predetermined pitch (magnetization pitch P) corresponding to an ink droplet ejection position interval is formed on the magnetic scale 26, in order to detect the position of the transportation belt 16 (that is, the recording sheet S). The magnetization pitch P which is the arrangement period of the elements to be detected (the N pole and the S pole) of the magnetic linear scale is set by the belt transportation speed and print resolution at the time of the printing of the printer 11 and, for example, has a value of 35 μm (if the resolution is 720 dpi) or 70 μm (if the resolution is 360 dpi).

Figure 4:
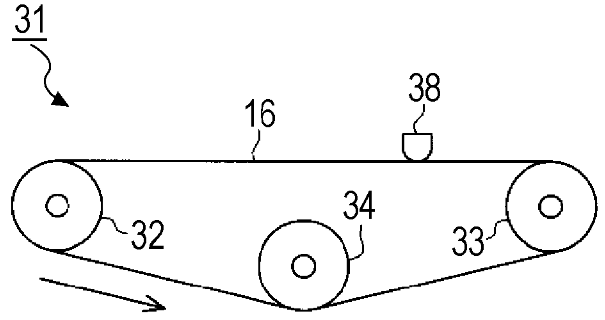
FIG. 4 is a side view showing a magnetizer.
Figure 5:
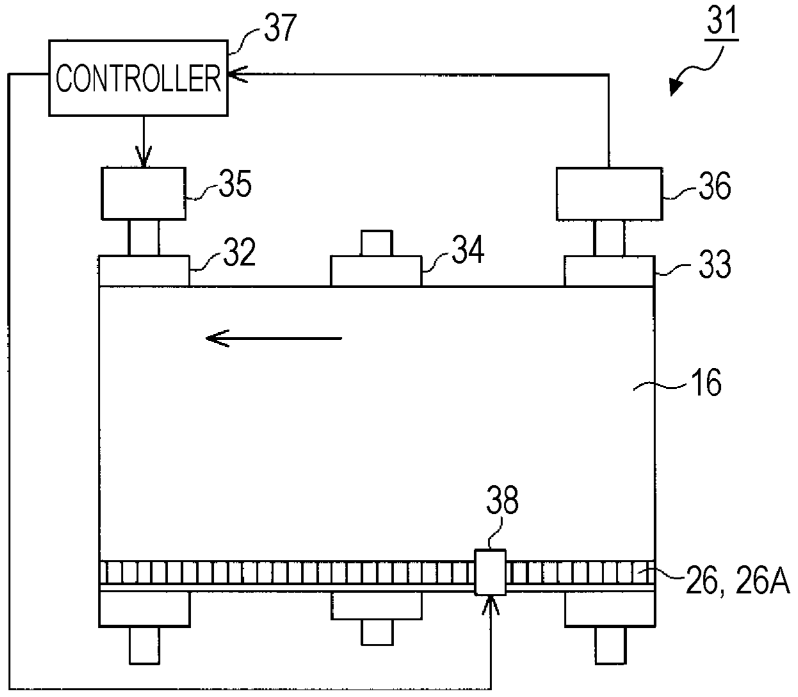
FIG. 5 is a plan view showing the magnetizer.

FIGS. 4 and 5 are views showing a magnetizer of the magnetic linear scale. FIG. 4 is a side view of the magnetizer and FIG. 5 is a plan view of the magnetizer. The magnetizer 31 includes a driving roller 32, a driven roller 33 and a tension roller 34, similar to the belt transportation device 12 of the printer 11. A magnetic layer 26A having a predetermined width is formed on the edge portion of the transportation belt 16, which does not correspond to a sheet transportation path, by a coating method. The transportation belt 16 is mounted so as to be wound on the rollers 32 to 34.

As shown in FIG. 5, an electric motor 35 (for example, a DC motor) is connected to the driving roller 32 directly or via a deceleration mechanism such that power is delivered. A high-resolution (for example, 7.20 million pulse/rev) rotary encoder 36 is attached to the driven roller 33. A controller 37 receives encoder pulses synchronized with the rotation angle from the rotary encoder 36 and controls the driving of the electric motor 35 on the basis of the encoder pulses such that the transportation belt 16 accurately rotates at a predetermined speed.

In the magnetizer 31, a writing magnetic head 38 shown in FIG. 4 is provided at a position corresponding to the magnetic layer 26A of the transportation belt 16 in a state of being slightly in contact with the magnetic layer 26A. As the writing magnetic head 38, for example, a magnetic sensor which can output a plurality of values, such as a giant magneto resistive effect (GMR) sensor or a magneto resistive effect (MR) sensor may be used. Alternatively, a hall element or a magnetic impedance (MI) element may be used.

The writing magnetic head 38 is connected to a writing control circuit (not shown) in the controller 37. This writing control circuit changes a current direction of a coil in the writing magnetic head 38 by a division signal obtained by dividing the encoder pulses from the rotary encoder 36 and writes the magnetization pattern, in which the N pole and the S pole are inverted with the predetermined magnetization pitch P, to the magnetic layer 26A. The division signal is obtained by a rate set according to the characteristics of the magnetizer 31 such as a roller eccentric amount or a belt thickness, which is previously measured. The magnetizer 31 is not limited to the above magnetization method and other methods of magnetizing the magnetic layer 26A so as to form the magnetic linear scale 26 may be employed. For example, a magnetic head may travel with respect to the magnetic layer of the stopped transportation belt. Accordingly, the magnetic linear scale 26 in which the predetermined magnetization pattern is recorded is wound on the rollers 13 to 15 of the printer 11.

The transportation belt 16 is formed by adhering both ends of rubber having a band shape and a predetermined length and has a joint. When an ink mist and a paper dust is adhered to the magnetic linear scale 26 or a shape defect such as a step difference occurs in the joint, omission (pulse omission) of the signal (pulse) from the magnetic sensor 27 configuring the linear encoder 28 occurs.

Figure 6:
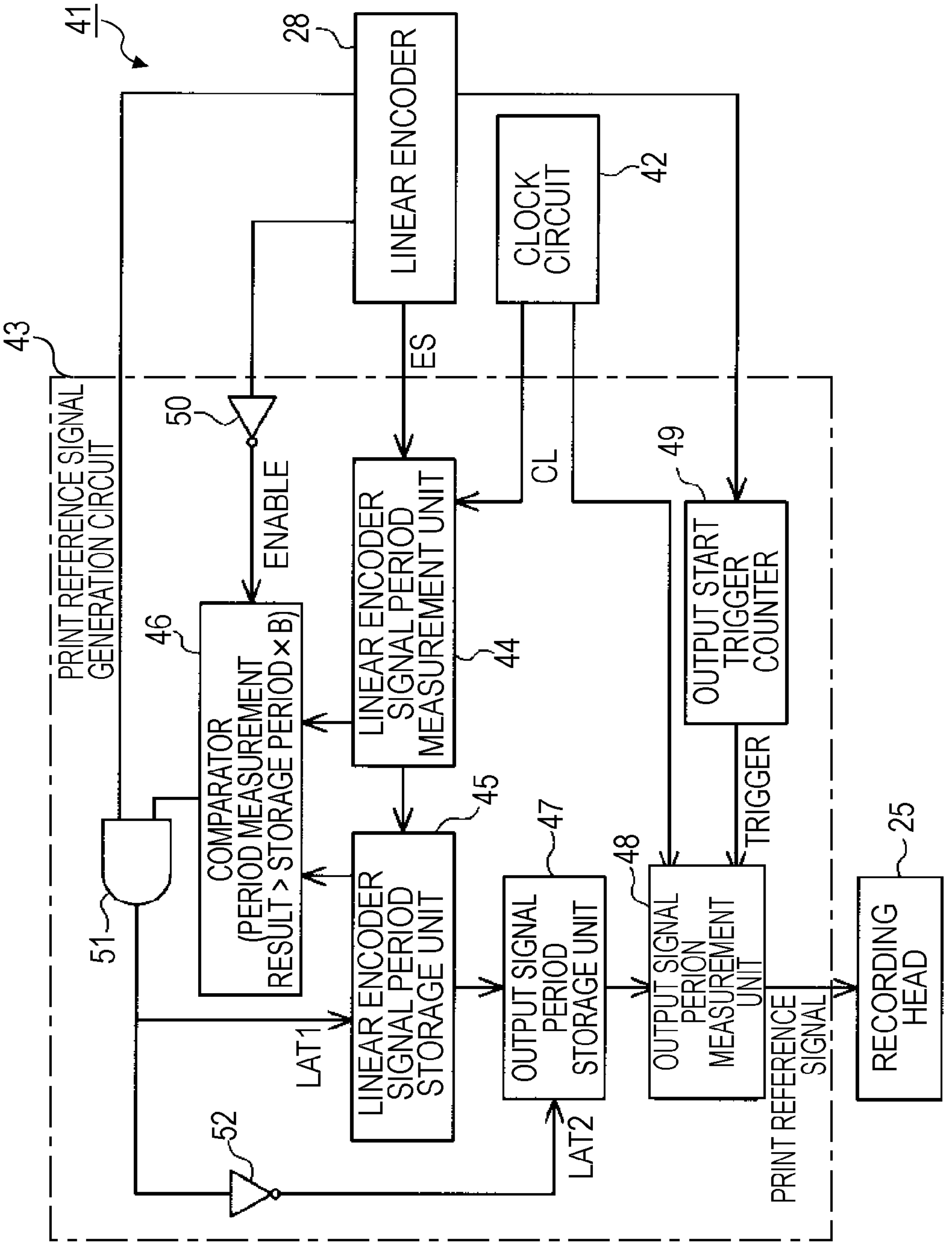
FIG. 6 is a circuit diagram showing the electrical configuration of a print reference signal generation device.

FIG. 6 shows a print reference signal generation device provided in the controller 30.

The print reference signal generation device 41 includes a linear encoder 28, a clock circuit 42, and a print reference signal generation circuit 43. The print reference signal generation circuit 43 generates a print reference signal on the basis of the input pulses from the linear encoder 28 and a clock signal CL from the clock circuit 42 and outputs the generated print reference signal to the recording head 25.

Here, a head driving circuit is provided in the recording head 25, and a discharge driving element (not shown) is driven according to the timing of the print reference signal such that the ink droplets are ejected from the nozzles. As the discharge driving element, a piezoelectric vibration element, an electrostatic driving element or a heater used in the ink jet method may be used.

As shown in FIG. 6, the print reference signal generation circuit 43 includes a linear encoder signal period measurement unit 44 as a measurement unit, a linear encoder signal period storage unit 45 configuring a storage unit, a comparator 46 as a detection unit, an output signal period storage unit 47 configuring the storage unit, an output signal period measurement unit 48 and an output start trigger counter 49.

The linear encoder signal period measurement unit 44 receives the linear encoder signal ES from the linear encoder 28 and the clock signal CL from the clock circuit 42 and measures a time (pulse period) until a next pulse of the linear encoder signal ES appears by counting the pulse number of the clock signal CL. At this time, since a period measurement result (measurement value) is transmitted to the comparator 46 whenever the clock is counted up, a comparison process is performed by the comparator 46 in real time. The period measurement result is stored in the linear encoder signal period storage unit 45 and is input to the comparator 46.

An Enable signal which is obtained by inverting the encoder signal from the linear encoder by a NOT circuit 50 is input to the comparator 46. The comparator 46 operates only when the linear encoder signal has a low level, on the basis of the Enable signal, and performs the comparison of Equation 1 on the basis of a current measurement period (period measurement result) measured by the linear encoder signal period measurement unit 44 and a previous measurement period (storage period) received from the linear encoder signal period storage unit 45.

$$\text{Measurement period } T\text{new} > \text{storage period } T\text{old} \times \text{detection set value } B \qquad \text{Equation 1}$$

where, the storage period Told is a newest measurement period of the past measurement periods stored in the linear encoder signal period storage unit 45. In the linear encoder signal period storage unit 45, plural pieces (two in the present example) of past measurement period data are stored. In general, previous measurement periods may be employed.

The detection set value B is a value for deciding a magnification ratio indicating whether pulse omission occurs if a period in which a pulse does not appears (that is, a measurement period Tnew in which measurement is being performed) becomes any times of the previous measurement period Told (storage period) and is set to, for example, "1.5" in the present embodiment. That is, the comparator 46 outputs a Low level signal to an input terminal of an AND circuit 51 if the current measurement period (the measurement period Tnew in which the measurement is being performed) exceeds B times (=Told×B) of the previous measurement period Told (storage period) so as to satisfy the condition of Equation 1 and outputs a Hi level signal if the condition of Equation 1 is not satisfied.

The linear encoder signal ES from the linear encoder 28 is input to the other input terminal of the AND circuit 51. The AND circuit 51 outputs a result of an AND calculation of the output of the comparator 46 and the linear encoder signal ES as a latch signal LAT1. Accordingly, if the Equation 1 is not satisfied, that is, if the pulse omission is not detected, the latch signal LAT1 is input from the AND circuit 51 to the linear encoder signal period storage unit 45. The period measurement result is latched in the linear encoder signal period storage unit 45 only when the output of the comparator 46 does not satisfy Equation 1 at a rising timing of the linear encoder signal ES. By this AND calculation, only the linear encoder signal period without the pulse omission can be stored in the linear encoder signal period storage unit 45.

A result obtained by performing a NOT calculation with respect to the AND calculation result of the AND circuit 51 of the output of the comparator 46 and the encoder signal ES by the NOT circuit 52 is input to the output signal period storage unit 47 as a latch signal LAT2. Since this latch signal LAT2 rises in a state in which the phase thereof is delayed from the linear encoder signal ES by a half period, the linear encoder signal period measurement result (output signal period) is latched in the output signal period storage unit 47 with a delay of a half period. The output signal period measurement unit 48 receives the clock signal CL and an output start trigger signal and outputs the print reference signal such that the output signal period stored in the output signal period storage unit 47 becomes a pulse period after the output start trigger signal is input. The output start trigger counter 49 includes a counter and a comparator and outputs the encoder signal as a trigger signal at a time point when the rising of the linear encoder signal ES is counted by two pulses. That is, the output signal period measurement unit 48 starts the output of the print reference signal in synchronization with the falling of a third pulse of the linear encoder signal ES.

The output signal period measurement unit 48 outputs a Low level signal when the count value of the pulse number of the clock signal reaches a half of the output signal period stored in the output signal period storage unit 47 and outputs a Hi level signal when the count value of the pulse number of the clock signal reaches the output signal period. Accordingly, the print reference signal is output from the output signal period measurement unit 48.

The output start trigger counter 49 sets an output start timing of the print reference signal and may employ, for example, a configuration in which the output of the print reference signal is started after a carriage speed is stabilized. That is, a configuration in which the print reference signal is not output in an acceleration region and a trigger is output after predetermined pulses (for example, 50 to 200 pulses) are first counted in order to output the print reference signal after the carriage speed reaches a predetermined speed may be employed. Alternatively, a configuration in which the trigger is output such that the output of the print reference signal is started when a front end of the sheet reaches a predetermined position may be employed.

Since the linear encoder signal period storage unit 45 does not need to store a large number of pieces of past period measurement data from the viewpoint of a memory capacity (memory space consumption amount), data of two pulses is stored in a memory (register). By this configuration, the output signal period measurement unit 48 outputs a signal obtained by delaying the linear encoder signal ES by two pulses as the print reference signal.

The detection set value B of the comparator 46 is determined the delay amount of the pulse. Since the removal of the data of the linear encoder signal period storage unit 45 is avoided while the pulse omission is detected, the detection set value B which exceeds the delay amount corresponding to a pulse omission detection period cannot be employed. For example, in the present example, since the delay amount is set to the value corresponding to the period of two pulses, the detection set value B is set to a value less than 2.

Figure 7:
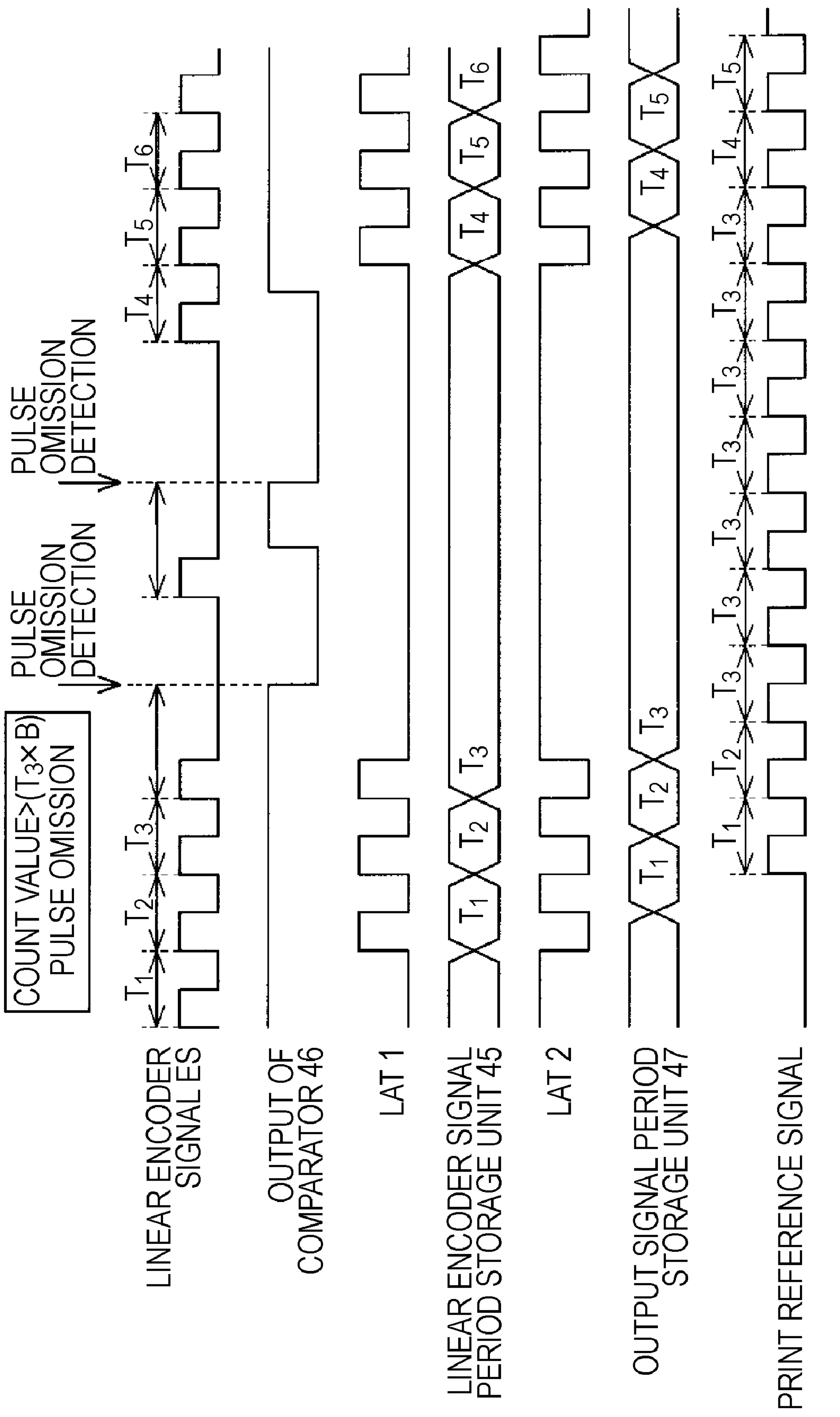
FIG. 7 is a timing chart showing the operation of the print reference signal generation device.

FIG. 7 is a timing chart showing the operation of the print reference signal generation device 41. If the pulse is not omitted, the linear encoder signal period measurement unit 44 measures the pulse period of the linear encoder signal ES. As shown in FIG. 7, for example, measurement periods $T_1$, $T_2$ and $T_3$ are sequentially measured. At this time, the count value of the measurement periods is less than a threshold of a product of the detection set value B and the newest measurement period stored in the linear encoder signal period storage unit 45 so as not to satisfy the condition of Equation 1, the comparator 46 outputs the Hi level signal and the linear encoder signal period storage unit 45 receives the latch signal LAT1. Since the transportation belt 16 is driven at a constant speed, substantially constant pulse periods are measured such that $T_1$, $T_2$ and $T_3$ are slightly changed in a very small range such as a speed change due to eccentricity of the roller 13. If the pulse is not omitted, the latch signal LAT1 is output in synchronization with the linear encoder signal ES. Since the comparison process of the comparator 46 is not performed at the time of the input of a first pulse and is started at the time of the input of a second pulse, the output of the latch signal LAT1 is started at the time of the output of the second pulse of the linear encoder signal ES and the measurement periods $T_1$, $T_2$ and $T_3$ are sequentially latched in the linear encoder signal period storage unit 45 with a delay of one period from the linear encoder signal ES.

The latch signal LAT2 input to the output signal period storage unit 47 rises at a timing delayed from the latch signal LAT1 by a half period via the NOT circuit 52, the measurement periods delayed by the half period from the linear encoder signal period storage unit 45 are stored in the output signal period storage unit 47 as the output signal periods $T_1$, $T_2$ and $T_3$. The output signal period measurement unit 48 generates and outputs the print reference signal by sequentially connecting the output signal periods $T_1$, $T_2$ and $T_3$ as the pulse period.

Meanwhile, for example, when the joint of the transportation belt 16 reaches a position to be detected of the sensor 27 or the paper dust or the ink mist is adhered to the magnetic linear scale 26 or the sensor 27 such that the pulse is omitted as shown in FIG. 7, the print reference signal generation device 41 operates as follows.

If the count value of the measurement periods measured by the linear encoder signal period measurement unit 44 exceeds the threshold of the product of the detection set value B and the newest measurement period $T_3$ stored in the linear encoder signal period storage unit 45 so as to satisfy the condition of Equation 1, the comparator 46 detects the omission of the pulse. As a result, the comparator 46 outputs the Low level signal and both the latch signals LAT1 and LAT2 does not rise such that the newest measurement period $T_3$ is held in the linear encoder signal period storage unit 45 over a period corresponding to a pulse omission period and the newest output signal period $T_3$ is held in the output signal period storage unit 47. Accordingly, if the pulse is omitted, the output signal period measurement unit 48 outputs the print reference signal in which the pulse is continued in the output signal period $T_3$.

Subsequently, if the cause of the pulse omission is solved, in the comparator 46, the condition of Equation 1 is not satisfied. At this time, measurement periods $T_4$, $T_5$ and $T_6$ are sequentially latched in the linear encoder signal period storage unit 45 and output signal periods $T_4$, $T_5$ and $T_6$ are sequentially latched in the output signal period storage unit 47 with a delay of a half period. As a result, the output signal period measurement unit 48 outputs the print reference signal by the pulses having the output signal periods $T_4$, $T_5$ and $T_6$.

Figure 8:
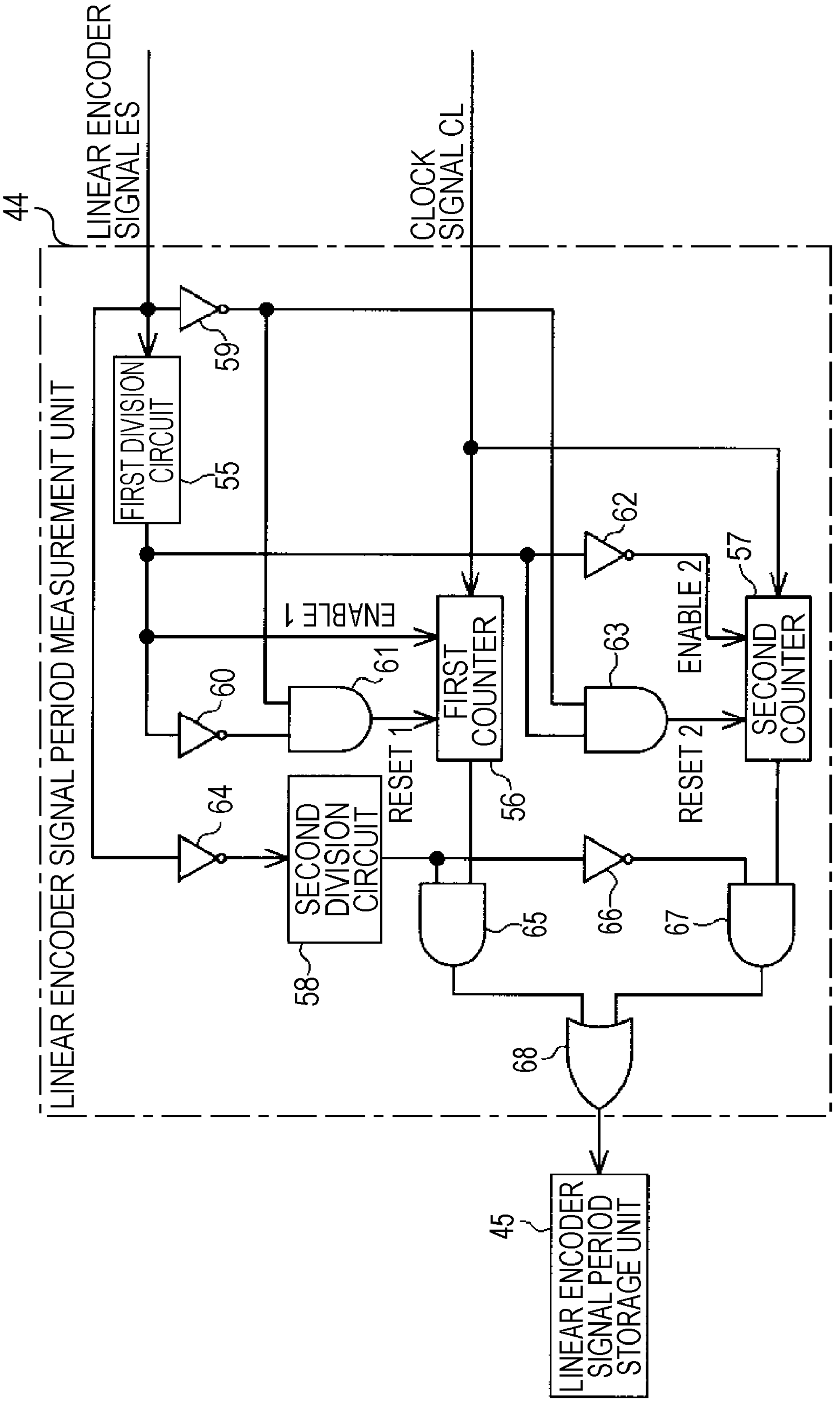
FIG. 8 is an electrical circuit diagram showing a linear encoder signal period measurement unit.
Figure 9:
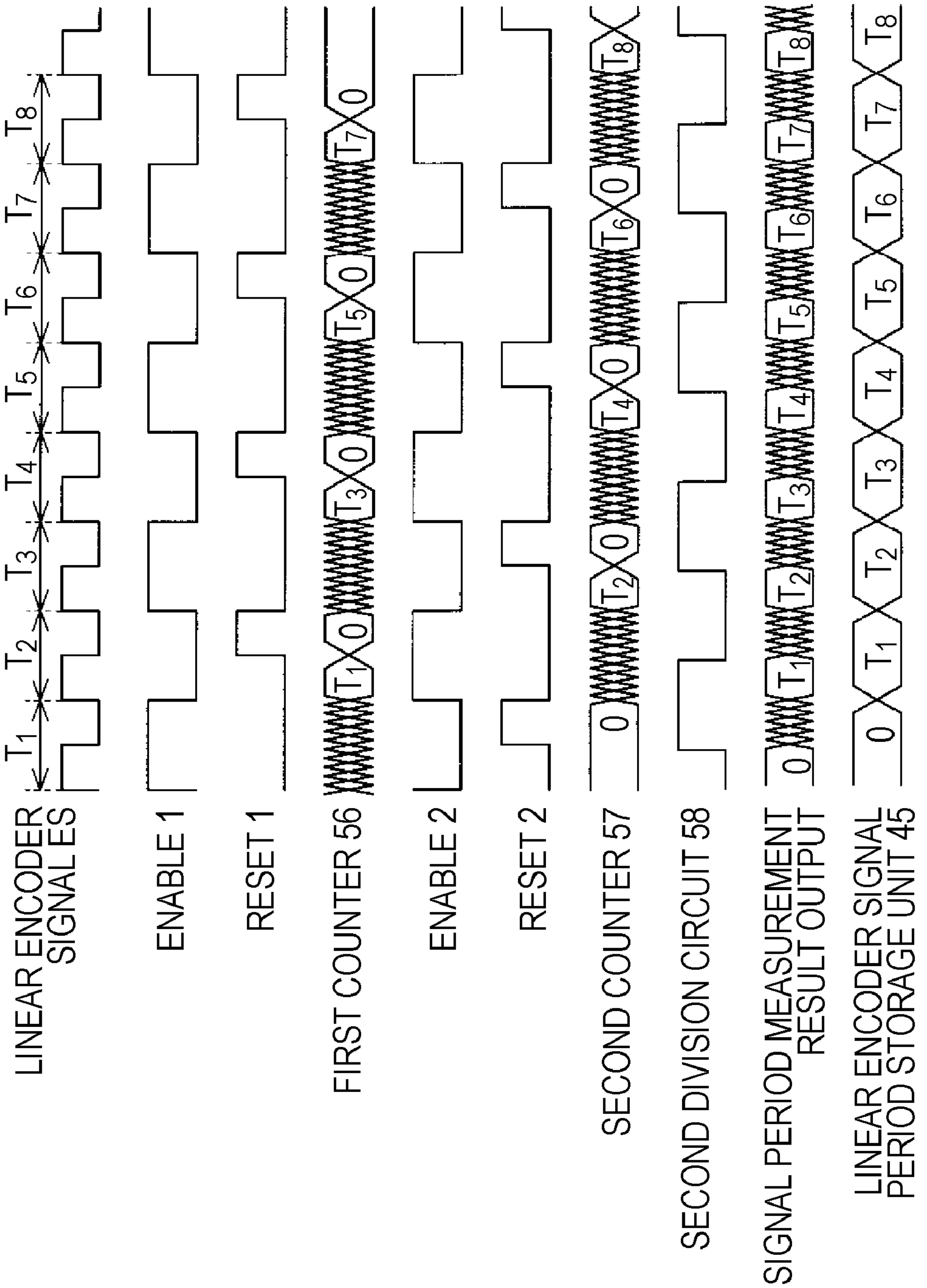
FIG. 9 is a timing chart showing the operation of the linear encoder signal period measurement unit.

Now, the circuit configuration of the linear encoder signal period measurement unit 44 will be described in detail. FIG. 8 is a view showing the detailed circuit configuration of the linear encoder signal period measurement unit and FIG. 9 is a timing chart showing the operation of the linear encoder signal period measurement unit. Hereinafter, description will be made with reference to FIG. 8 and, if necessary FIG. 9.

As shown in FIG. 8, the linear encoder signal period measurement unit 44 includes a first division circuit 55, a first counter 56, a second counter 57, and a second division circuit 58. The two counters 56 and 57 are included in order to obtain the output obtained after the count value is decided, instead of simultaneously obtaining the count value and the output. The two counter 56 and 57 alternately measure the pulse period of the linear encoder signal ES one period by one period. That is, the pulse period of the pulses between the pulses, of which the pulse period is counted by the first counter 56, is counted by the second counter 57.

The first division circuit 55 divides the linear encoder signal ES by twice of the period and outputs an Enable signal Enable 1 for operating the first counter 56 (see FIG. 9). The first counter 56 counts the pulse number of the clock signal when the Enable signal Enable 1 is the Hi level signal.

As shown in FIG. 8, an AND circuit 61 performs an AND calculation of a signal obtained by inverting the linear encoder signal ES by a NOT circuit 59 and a signal obtained by inverting the Enable signal Enable 1 by a NOT circuit and inputs the calculated result to the first counter 56 as a reset signal Reset 1. The first counter 56 counts the pulse number of the clock signal CL when the Enable signal Enable 1 rising over one period of the linear encoder signal ES is input, and stops the count when the reset signal Reset 1 is input.

As shown in FIG. 8, the second counter 57 receives an Enable signal Enable 2 which is obtained by inverting the Enable signal Enable 1 by a NOT circuit 62. The second counter 57 counts the pulse number of the clock signal when the Enable signal Enable 2 is the Hi level signal.

An AND circuit 63 performs an AND calculation with respect to a signal obtained by inverting the linear encoder signal ES by a NOT circuit 59 and the Enable signal Enable 1 and inputs the calculated result to the second counter 57 as a Reset signal Reset 2. Accordingly, the second counter 57 counts the pulse periods between the pulse periods counted by the first counter 56 among the pulse periods of the linear encoder signal ES.

The second division circuit 58 shown in FIG. 8 receives a signal obtained by inverting the linear encoder signal ES by a NOT circuit 64 and divides the received signal by twice of the period (see FIG. 9). An AND circuit 65 outputs a result of an AND calculation of the output of the second division circuit 58 and the output of the first counter 56 to an OR circuit 68. An AND circuit 67 outputs a result of an AND calculation of a signal obtained by inverting the output of the second division circuit 58 by a NOT circuit 66 and the output of the second counter 57 to the OR circuit 68. That is, the AND circuit 65 outputs the output of the first counter 56 to the OR circuit 68 when the output of the second division circuit 58 has the Hi level and the AND circuit 67 outputs the output of the second counter 57 to the OR circuit 68 when the output of the second division circuit 58 has the Low level. The OR circuit 68 alternately outputs the count result of the first counter 56 received from the AND circuit 65 and the count result of the second counter 57 received from the AND circuit 67, and the output data is output to the linear encoder signal period storage unit 45 and the comparator 46 as the signal period measurement result shown in FIG. 9. As a result, the measured pulse periods $T_1$, $T_2$ and $T_3$ of the linear encoder signal ES are sequentially stored in the linear encoder signal period storage unit 45 with a delay of one period as shown in FIG. 9.

In the printer 11 in which the transportation belt 16 is mounted, the print reference signal is generated by the print reference signal generation device 41 in the controller 30 on the basis of the linear encoder signal ES in which the magnetic pattern is reproduced by the magnetic sensor 27. In addition, the inks are ejected from the nozzles of the recording heads 25 using the rising (or the falling) edges of the print reference signal as ejection timings such that ink droplets are struck on the recording sheet S. Thus, image or letters are printed.

According to the above-described first embodiment, the following effects can be obtained.

(1) Since the pulse period of the linear encoder signal ES having the pulses according to the transportation position of the transportation belt 16 is measured and the print reference signal is generated by connecting the measured pulse periods, high print position precision can be obtained although the speed of the transportation belt 16 is changed. For example, although the eccentricity of the roller 13 occurs, high print position precision can be obtained.

(2) Although the contact sensor 27 is used or although the omission of the pulse of the linear encoder signal ES due to the joint of the transportation belt 16 or the omission of the pulse due to the adhesion of the paper dust or the ink mist occurs suddenly, since the pulses are generated on the basis of the measurement period before the omission of the pulse is detected, the print reference signal of the adequate pulse period can be output. Although the omission of the signal occurs suddenly, the print reference signal of the pulse period with relatively high interpolation precision can be generated.

(3) The pulses are sequentially connected at an interval of the measurement period using the measurement period several pulses (for example, two pulses) before, which is measured with respect to the output pulses of the linear encoder 28, such that the print reference signal is generated and output. That is, the results of measuring the encoder signal periods are connected so as to generate the print reference signal. Accordingly, the print reference signal according to the belt speed can be generated. Accordingly, a problem that the phase difference of the pulse does not occur before and after the omission of the pulse occurs is not caused. For example, if the print reference signal is generated on the basis of the encoder pulses according to the transportation position of the transportation belt, it is difficult to perform a phase matching process of eliminating a phase difference due to the speed change of the transportation belt, between the pulses before and after the omission of the pulse occurs. However, according to the present embodiment, since the pulses are sequentially connected at the interval of the measurement period, the phases of the pulses do not need to be matched. Accordingly, since the slight change of the speed of the transportation belt 16 is allowed, the high-precision centering of the roller 13 is not required.

(4) Although the speed is slightly changed, the print reference signal for preventing the striking position from being shifted is generated from a belt speed feedback signal (linear encoder signal). Accordingly, the high-precision printer 11 can be realized by simple motor control such as closed loop control. That is, a relatively simple circuit configuration can be realized, compared with the constant speed control of the motor employed in the printer disclosed in JP-A-2003-280484 or JP-A-2005-350195.

(5) In the comparator 46, the pulse omission is detected by performing the comparison process of the condition of Equation 1 which is "measurement period (time until the pulse is generated)>pulse period just before×detection set value B", and the print reference signal using the pulse period of the linear encoder signal ES just before the omission of the pulse occurs is continuously output after the omission of the pulse of the linear encoder 28 is detected.

When a significant change occurs by comparison with the pulse period just before, it is determined that the omission of the pulse occurs. Accordingly, although the speed of the transportation belt 16 is changed, the change of the speed and the omission of the pulse can be accurately determined. For example, in JP-A-2003-280484 or JP-A-2005-350195, even when the pulse period exceeds a predetermined threshold due to the change of the speed of the transportation belt, it is determined that the omission of the pulse occurs. In contrast, according to the present embodiment, the erroneous decision of the pulse omission can be avoided with more certainty.

(6) The period measurement result several pulses (for example, two pulses) before is used as the period measurement result used by the print reference signal. Accordingly, it is possible to prevent the pulse of the print reference signal from being omitted when the pulse of the encoder signal is omitted.

(7) The detection set value B is larger than 1 and smaller than a delay pulse number (B=1.5 in the present example). Accordingly, only the period measurement data of the same number as the delay pulse number may be stored in the encoder signal period storage unit 45. In order to hold the period measurement data, the storage capacity necessary for the linear encoder signal period storage unit 45 can be reduced.

Second Embodiment

In the present embodiment, a problem that the print reference signal is generated in a pulse period based on an old measurement period when the pulses of one linear encoder are continuously omitted is solved. In the present embodiment, two sensors configuring the linear encoder are used. However, in the configuration of the present embodiment, when the pulse omission is detected in the output signal of one of the two sensors 72 and 73 configuring the linear encoder, the print reference signal is generated using the measurement period of the output signal of the other sensor. The configuration of the print 11 is equal to that of the first embodiment except for the configuration of the print reference signal generation device and thus only the print reference signal generation device will be described in more detail.

Figure 10:
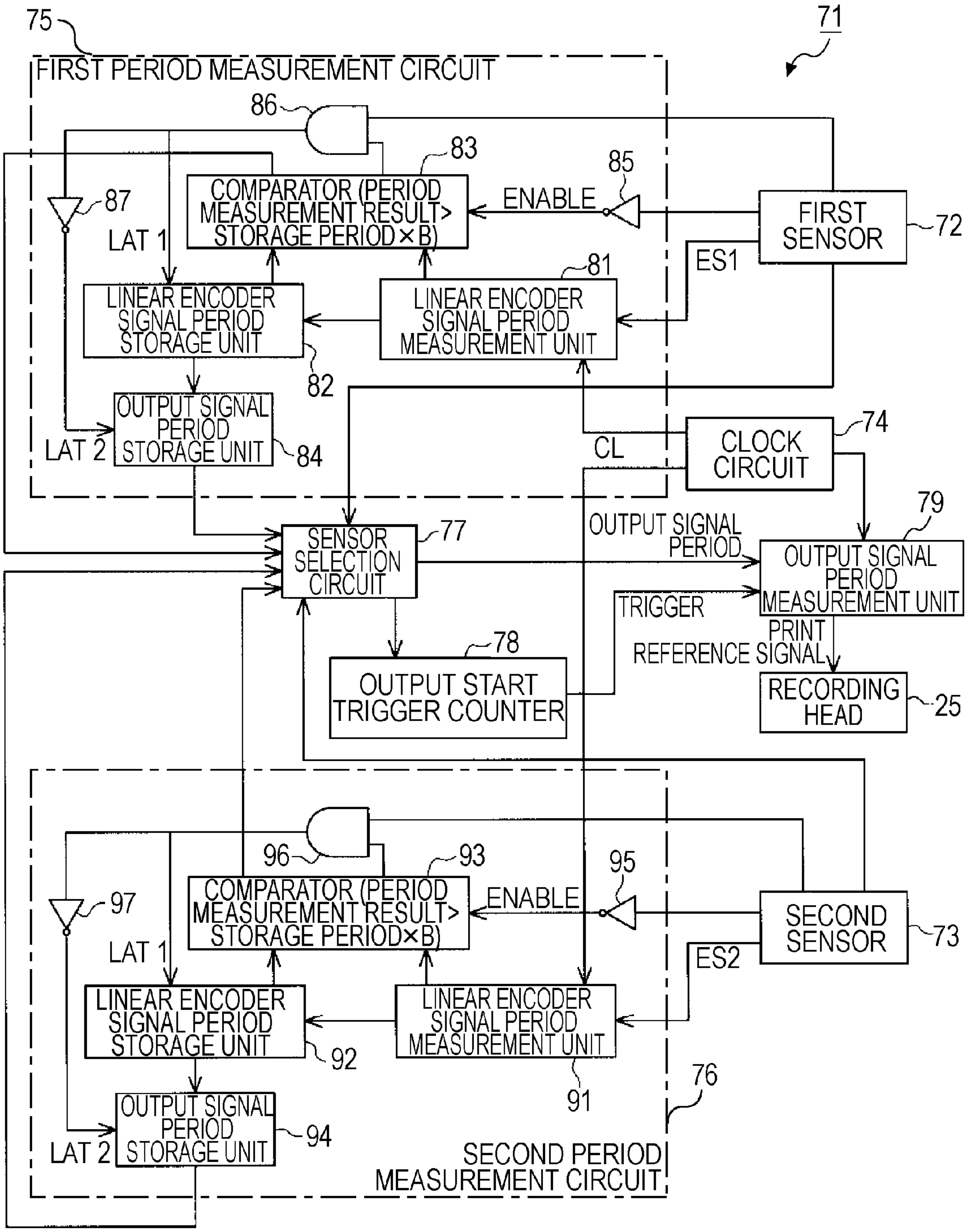
FIG. 10 is a circuit diagram showing the electrical configuration of a print reference signal generation device according to a second embodiment of the invention.

FIG. 10 shows the circuit configuration of the print reference signal generation device included in the controller. As shown in FIG. 10, the print reference signal generation device 71 includes a first sensor 72, a second sensor 73, a clock circuit 74, a first period measurement circuit 75, a second period measurement circuit 76, a sensor selection circuit 77, an output start trigger counter 78, and an output signal period measurement unit 79.

The first sensor 72 and the second sensor 73 are constituted by the same magnetic sensor as the first embodiment and are arranged on the magnetic linear scale 26 at predetermined positions to be detected. For example, in a period in which one of the two sensors 72 and 73 detects the joint of the transportation belt 16, the other sensor is positioned so as to detect a portion without the joint. Actually, the sensors are arranged on the magnetic linear scale 26 so as to be separated from each other by a predetermined distance in a range of 1 to 20 cm.

The first period measurement circuit 75 measures the pulse period of an linear encoder signal ES1 (also referred to as a first linear encoder signal) of the first sensor 72 and the second period measurement circuit 76 measures the pulse period of a linear encoder signal ES2 (also referred to as a second linear encoder signal) of the second sensor 73. The first period measurement circuit 75 and the second period measurement circuit 76 have the same basic circuit configuration and are obtained by removing the output signal period measurement unit 48 and the output start trigger counter 49 from the circuit configuration of the printer reference signal generation circuit 43 shown in FIG. 6 according to the first embodiment. That is, the first period measurement circuit 75 includes a linear encoder signal period measurement unit 81, a linear encoder signal period storage unit 82, a comparator 83, an output signal period storage unit 84, a NOT circuit 85, an AND circuit 86 and a NOT circuit 87. The second period measurement circuit 76 includes a linear encoder signal period measurement unit 91, a linear encoder signal period storage unit 92, a comparator 93, an output signal period storage unit 94, a NOT circuit 95, an AND circuit 96 and a NOT circuit 97. The operations of the circuits configuring the first period measurement circuit 75 and the second period measurement circuit 76 are equal to the operations of the corresponding circuits in the print reference signal generation circuit 43 of FIG. 6 described in the first embodiment.

That is, in the first period measurement circuit 75, if the measurement period of the linear encoder signal period measurement unit 81 for measuring the pulse period of the linear encoder signal ES1 from the first sensor 72 does not exceed the product of the storage period of the linear encoder signal period storage unit 82 and the detection set value B in the comparator 83, the measurement period one pulse before is latched in the output signal period storage unit 84. In contrast, in the second period measurement circuit 76, if the measurement period of the linear encoder signal period measurement unit 91 for measuring the pulse period of the linear encoder signal ES2 from the second sensor 73 does not exceed the product of the storage period of the linear encoder signal period storage unit 92 and the detection set value B in the comparator 93, the measurement period one pulse before is latched in the output signal period storage unit 94.

The comparator 83 outputs the Hi level signal if the pulse omission does not occur in the output of the first sensor 72 and outputs the Low level signal if the pulse omission occurs. The comparator 93 outputs the Hi level signal if the pulse omission does not occur in the output of the second sensor 73 and outputs the Low level signal if the pulse omission occurs.

The sensor selection circuit 77 receives the outputs of the comparator 83 and the output signal period storage unit 84 of the first period measurement circuit 75 and the outputs of the comparator 93 and the output signal period storage unit 94 of the second period measurement circuit 76.

The sensor selection circuit 77 selects and outputs the output signal period stored in the output signal period storage unit 84 of the first period measurement circuit 75 when the comparator 83 does not detect the pulse omission and the Hi level signal is received from the comparator 83. The sensor selection circuit selects and outputs the output signal period stored in the output signal period storage unit 94 of the second period measurement circuit 76 when the comparator 93 does not detect the pulse omission and the Hi level signal is received from the comparator 93. If both the inputs from the comparators 83 and 93 are the Hi level signal, the sensor selection circuit 77 preferentially selects and outputs the output signal period of a sensor, which is previously set to a preferential sensor, of the two sensors 72 and 73. If both the inputs from the comparators 83 and 93 are the Low level signal, the sensor selection circuit 77 selects and outputs the output signal period of the preferential sensor of the sensors 72 and 73. If both the inputs from the comparators 83 and 93 are the Low level signal, the sensor selection circuit 77 may select and output the output signal period of the sensor which the pulse omission is not detected up to now.

The sensor selection circuit 77 receives the linear encoder signals ES1 and ES2 from the both sensors 72 and 73 and the sensor selection circuit 77 outputs the linear encoder signal ES1 or ES2 of the selected sensor of the two sensors 72 and 73 to the output start trigger counter 78. The output start trigger counter 78 outputs the trigger to the output signal period measurement unit 79 if the count of a predetermined number of the pulses of the linear encoder signal is completed.

The output signal period measurement unit 79 outputs the print reference signal in the pulse period based on the output signal period received from the sensor selection circuit 77 after receiving the trigger. In more detail, the output signal period measurement unit 79 outputs the Low level signal when the count value of the pulse number of the clock signal CL counted by the counter is matched with a half of the output signal period received from the sensor selection circuit 77 and outputs the Hi level signal when the count value of the pulse number of the clock signal reaches the output signal period. Accordingly, the output signal period measurement unit 79 outputs the print reference signal.

The sensor selection circuit 77 switches the signals received from the comparators 83 and 93 to the Hi level signal when the pulse omission is detected and the same pulse period is continuously output for at least several minutes of the predetermined pulses (or at least a predetermined time), and checks the output of the pulses of the linear encoder signal when the output signal period returns to a newest measurement period. That is, the sensor selection circuit 77 returns the output signal period to a newest measurement period after checking that a plural number (for example, two) of normal pulses are output from the sensor 72 or 83 which returns on the basis of the linear encoder signals ES1 and ES2. This is because the pulse period of the print reference signal is unnecessarily changed by returning to the pulse omission although the pulse is temporarily output.

Figure 11:
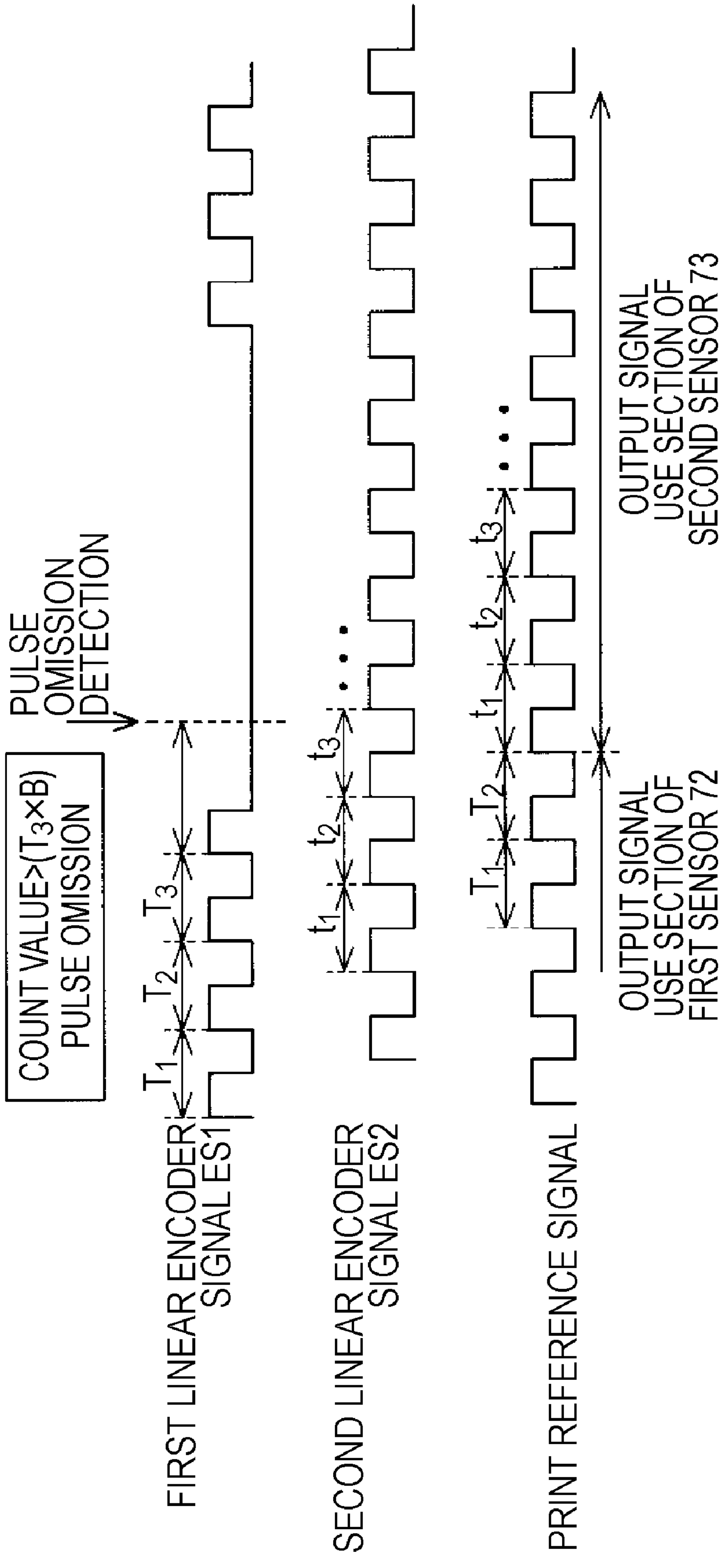
FIG. 11 is a timing chart showing the operation of the print reference signal generation device.

FIG. 11 is a timing chart showing the operation of the print reference signal generation device 71. When the pulse omission does not occur in both the linear encoder signals ES1 and ES2 output from the first sensor 72 and the second sensor 73, the sensor selection circuit 77 selects and outputs the output signal period from the first period measurement circuit 75 corresponding to the first sensor 72 which is the preferential sensor to the output signal period measurement unit 79. As a result, the output signal period measurement unit 79 outputs the print reference signal generated using the measurement periods T1 and T2 of the output signal (the first linear encoder signal ES1) of the first sensor 72.

In contrast, when the pulse omission occurs in the output signal of the first sensor 72 due to the joint of the transportation belt 16 or the adhesion of the paper dust or the ink mist, in the comparator 83, the count value of the linear encoder signal period measurement unit 81 exceeds the threshold of the product of the storage period ($T_3$ in the example of FIG. 11) of the linear encoder signal period storage unit 82 and the detection set value B and it is determined that the pulse omission occurs. If it is determined that the pulse omission occurs, the comparator 83 outputs the Low level signal to the sensor selection circuit 77. As a result, the sensor selection circuit 77 selects the output signal period from the output signal period storage unit 94 of the comparator 93 for outputting the Hi level signal. As a result, the output signal period measurement unit 79 outputs the print reference signal generated using the measurement periods t1, t2, t3, . . . of the output signal (the second linear encoder signal ES2) of the second sensor 73.

When the pulse omission is detected in both the sensors 72 and 73, the print reference signal is generated in the pulse period measured just before the pulse omission is detected by the first sensor 72 which is the preferential sensor. Alternatively, the preferential sensor is not restricted, and a configuration in which the output signal period of the sensor in which the pulse omission does not occur up to now is selected by the sensor selection circuit 77 and the print reference signal is generated in the pulse period measured just before the pulse omission is detected by the sensor may be employed.

Accordingly, according to the second embodiment, the following effect can be obtained.

(8) According to the first embodiment, if the signal is omitted, the pulses of the print reference signal are generated using the previous measurement period. Accordingly, if the signal omission period is long, the period may be different from an actual period. However, according to the second embodiment, a plurality (two in the present example) of sensors 72 and 73 are provided and the print reference signal is generated on the basis of the output pulse of one sensor. If the signal is omitted, the sensor is switched to the other sensor and the print reference signal is generated on the basis of the output pulse. Accordingly, although the pulse omission period is long, an error in the period according to the actual transportation speed can be suppressed.

(9) If the pulse omission occurs for a long time due to the joint of the transportation belt 16 or the adhesion of the paper dust or the ink mist, although the print reference signal of the predetermined period is generated on the basis of the output pulse of a predetermined-period time, the striking position of the ink droplet is shifted due to the change in the speed of the transportation belt 16. Accordingly, the method of connecting the period measurement results using the two sensors 72 and 73 is used. Accordingly, since the alignment of the sensors 72 and 73 can be roughly performed, it is possible to cope with the pulse omission for the long time.

(10) Since the pulse periods are connected using the pulse periods measured from the output pulse of the linear encoder 28 so as to sequentially generate the pulses such that the print reference signal is output, a problem that a phase difference between the pulses of the print reference signal before and after the pulse omission occurs does not occurs does not occur.

The invention is not limited to the above-described embodiments and the following modified examples may be realized.

MODIFIED EXAMPLE 1

In the above-described embodiments, if the pulse omission detection state is continued for a predetermined time, a configuration for informing a user of the cleaning of the linear encoder may be employed.

MODIFIED EXAMPLE 2

A cleaner for cleaning the magnetic linear scale or the sensor may be provided. By removing the paper dust or the ink mist by the cleaner, the pulse omission can be suppressed from being generated and early restoration after the pulse omission occurs can be realized.

MODIFIED EXAMPLE 3

In the second embodiment, at least three sensors may be provided with respect to one magnetic linear scale.

MODIFIED EXAMPLE 4

The attachment position of the scale configuring the encoder is not limited to the transportation belt. For example, a rotary magnetic scale may be provided on the circumferential surface of the end of the roller configuring the belt transportation device 12. Alternatively, the scale may be provided on another driven body positioned on the power delivering path between the electric motor which is the power source and an object to be driven.

MODIFIED EXAMPLE 5

The transportation unit for transporting the recording medium such as the sheet is not limited to the transportation belt method. For example, it is applicable to a printer including a roller type transportation device including a plurality of roller devices each including a driving roller and a driven roller arranged on the transportation path. For example, the magnetic scale is provided on the circumferential surface of the end of the roller or a rotary encoder type rotation plate magnetic scale may be provided on a rotation driving shaft of a power delivering system. In a belt transportation method of a line printer, a configuration in which a plurality of belts arranged between pairs of rollers on the upstream side and the downstream side of the transportation direction are wound in a zigzag shape may be employed. A configuration in which a drum without a transportation belt is included and printing is performed by a recording unit in a state in which the recording sheet is attracted on the outer circumferential surface of the drum may be employed.

MODIFIED EXAMPLE 6

The print reference signal generation device is not limited to the configuration of hardware. When a CPU executes a program stored in a memory, a period measurement process of measuring the pulse period of the encoder signal, a comparison process of determining whether or not the condition of Equation 1 is satisfied in order to determine whether or not the pulse omission occurs, and a pulse generation process of generating the print reference signal on the basis of the measurement pulse period several pulses before may be realized by software.

MODIFIED EXAMPLE 7

The pulse generation device is not limited to the line printer and is applicable to a serial type printer for performing printing while the recording head moves (scans) in a sheet width direction. That is, the driven body is not limited to the component of the medium transportation unit and may be a movement unit such as a carriage in which the recording head is mounted. For example, the linear encoder is provided in parallel to the movement path of the carriage, and the linear encoder signal ES from the sensor which moves together with the carriage is input to the signal generation circuit of the above-described embodiments so as to generate the print reference signal.

MODIFIED EXAMPLE 8

The encoder (the linear encoder and the rotary encoder) is not limited to the magnetic encoder and an optical encoder may be employed. In the optical encoder, when slits are provided in the scale with a predetermined pitch and the opening shape or the opening area of the slits are periodically changed such that the light reception amount of a light-receiving sensor for receiving the light emitted from a light source (light-emitting element) and passing through the slits is periodically changed, the linear encoder signal ES of which the amplitude is periodically changed can be obtained. In the optical encoder, a reflective encoder may be employed instead of the transmissive encoder.

MODIFIED EXAMPLE 9

Although the image forming apparatus is embodied in the ink jet recording apparatus as a fluid ejection apparatus in the above-described embodiments, a fluid ejection apparatus for ejecting or discharging other fluids excluding the ink (a liquid in which particles of a functional material is dispersed or mixed in a liquid, a fluid such as gel, and a solid which can be ejected as a fluid (for example, particulate including toner)) may be embodied. For example, a liquid ejection apparatus for ejecting a liquid including a material such as an electrode material or a coloring material (pixel material) used for manufacturing a liquid crystal display, an electroluminescence (EL) display and a surface emission display in a dispersion or melting manner, a liquid ejecting apparatus for ejecting a transparent resin liquid such as ultraviolet curing resin in order to form a minute semi-spherical lens (optical lens) used in an optical communication element, a liquid ejecting apparatus for ejecting an etching solution of acid or alkali in order to etch a substrate, and a fluid ejecting apparatus for ejecting a fluid such as gel may be employed. A predetermined pattern formed by striking the ejected fluid (dot) on a target by the above-described apparatus is included in an image (pattern image) formed by the image forming apparatus in the present specification. The term "fluid" does not include a fluid composed of only gas and includes a liquid (an inorganic solvent, an organic solvent, a solution, liquid resin, and liquid metal (melted metal)) a particulate and a fluid. The invention is applicable to other printers excluding the ink jet printer. For example, the invention is applicable to a dot impact printer, a thermal transfer printer and a laser printer.

What is claimed is:

1. An image forming apparatus for performing recording in order to form an image on a transported recording medium, the apparatus comprising:

a transportation unit which transports the recording medium;

a recording unit which performs recording in order to form the image on the recording medium transported by the transportation unit;

an encoder which outputs an encoder signal including pulses according to a transportation position of the transportation unit;

a measurement unit which measures a pulse period of the encoder signal;

a storage unit which stores the measured pulse period;

a detection unit which detects pulse omission of the encoder signal on the basis of the measured value of the measurement unit; and a pulse generation unit which generates a recording timing pulse on the basis of the pulse period stored in the storage unit when the pulse omission is not detected and generates the recording timing pulse on the basis of the pulse period stored in the storage unit and measured before the pulse omission when the pulse omission is detected, wherein the storage unit latches pulse period data on the basis of the detected result when the detection unit detects the pulse omission, the detection unit is set so as to detect the pulse omission when the pulse period measured by the measurement unit exceeds the threshold of a product of a newest pulse period, in which the pulse omission is not detected, and a set value, and the set value is set to a value less than the number of pieces of data to be latched in the storage unit.

2. The apparatus according to claim 1, wherein the detection unit detects the pulse omission when the value measured by the measurement unit exceeds a threshold having a value larger than the pulse period according to the pulse period stored in the storage unit.

3. The apparatus according to claim 2, wherein:

the encoder includes a scale unit provided along a transportation direction of the transportation unit and a plurality of sensors each of which outputs the encoder signal including the pulses according to the transportation position of the transportation unit using different positions of the scale unit as an object to be detected, and the detection unit detects the pulse omission on the basis of the encoder signal from at least one of the plurality of sensors and includes a switching unit which switches the sensor using the pulse period when the pulse generation unit generates the pulses when the pulse omission is detected.

4. The apparatus according to claim 2, wherein, when the detection unit detects the pulse omission in all the plurality of sensors, the pulse generation unit generates the pulses on the basis of the pulse period of one sensor stored in the storage unit.

5. A pulse generating method of generating a recording timing pulse for deciding a recording timing when recording is performed in order to form an image on a recording medium, the method comprising:

measuring a pulse period of an encoder signal for outputting the encoder signal according to a transportation position of a transportation unit for transporting the recording medium;

storing the measurement pulse period in the storage unit;

detecting pulse omission of the encoder signal using a detection unit; and generating the recording timing pulse on the basis of the pulse period stored in the storage unit when the pulse omission is not detected and generating the recording timing pulse on the basis of the pulse period stored in the storage unit and measured before the pulse omission when the pulse omission is detected, wherein the storage unit latches pulse period data on the basis of the detected result when the detection unit detects the pulse omission, the detection unit is set so as to detect the pulse omission when the measured pulse period exceeds the threshold of a product of a newest pulse period, in which the pulse omission is not detected, and a set value, and the set value is set to a value less than the number of pieces of data to be latched in the storage unit.

* * * * *